(12) United States Patent
Tan et al.

(10) Patent No.: US 9,859,127 B1
(45) Date of Patent: Jan. 2, 2018

(54) LINE EDGE ROUGHNESS IMPROVEMENT WITH PHOTON-ASSISTED PLASMA PROCESS

(71) Applicant: Lam Research Corporation, Fremont, CA (US)

(72) Inventors: Zhongkui Tan, San Jose, CA (US); Qing Xu, Fremont, CA (US); Qian Fu, Pleasanton, CA (US); Sangjun Park, Fremont, CA (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 15/179,792

(22) Filed: Jun. 10, 2016

(51) Int. Cl.
*H01L 21/3065* (2006.01)
*H01L 21/308* (2006.01)
*G03F 7/40* (2006.01)
*H01J 37/32* (2006.01)

(52) U.S. Cl.
CPC ............ *H01L 21/3065* (2013.01); *G03F 7/40* (2013.01); *H01J 37/3244* (2013.01); *H01J 37/32082* (2013.01); *H01L 21/3081* (2013.01); *H01L 21/3085* (2013.01)

(58) Field of Classification Search
None
See application file for complete search history.

(56) References Cited

U.S. PATENT DOCUMENTS

| 4,668,337 | A | * | 5/1987 | Sekine | H01L 21/3065 156/345.38 |
| 5,183,531 | A | * | 2/1993 | Terakado | H01L 21/3065 216/51 |
| 5,512,331 | A | * | 4/1996 | Miyakuni | H01L 21/30621 257/E21.222 |
| 6,153,115 | A | * | 11/2000 | Le | H01J 37/32935 216/60 |
| 6,307,174 | B1 | * | 10/2001 | Yang | B23K 10/00 204/298.31 |
| 6,541,924 | B1 | * | 4/2003 | Kane | H05B 41/24 313/607 |
| 7,977,242 | B2 | | 7/2011 | Sadjadi et al. | |
| 8,282,847 | B2 | | 10/2012 | Romano et al. | |
| 8,435,608 | B1 | * | 5/2013 | Subramonium | C23C 16/045 427/569 |
| 8,491,800 | B1 | * | 7/2013 | Dorsey | G11B 5/746 216/22 |
| 9,403,675 | B2 | * | 8/2016 | Ho | B81C 1/00 |
| 2002/0037637 | A1 | * | 3/2002 | Xing | H01L 21/0332 438/552 |
| 2002/0079294 | A1 | * | 6/2002 | Tadera | B23K 10/003 219/121.43 |
| 2005/0167839 | A1 | * | 8/2005 | Wetzel | H01L 21/76802 257/758 |
| 2008/0099450 | A1 | * | 5/2008 | Lewington | H01J 37/32091 219/121.58 |

(Continued)

*Primary Examiner* — Allan Olsen
(74) *Attorney, Agent, or Firm* — Beyer Law Group LLP

(57) ABSTRACT

A photon-assisted plasma processing method for processing a substrate with a process layer is provided. A process gas is flowed into the chamber. The process gas is formed into a plasma. The process layer is exposed to the plasma. The process layer is illuminated with a light with a wavelength of between 200 nm and 1 micron, while exposing the substrate to the plasma.

11 Claims, 5 Drawing Sheets

(56) References Cited

U.S. PATENT DOCUMENTS

| | | | | |
|---|---|---|---|---|
| 2008/0299494 | A1* | 12/2008 | Bencher | H01L 21/0337 430/313 |
| 2010/0173493 | A1* | 7/2010 | Kushibiki | H01L 21/0337 438/694 |
| 2011/0117202 | A1* | 5/2011 | Bourke, Jr. | H05B 41/2806 424/490 |
| 2012/0270339 | A1* | 10/2012 | Xie | H01L 21/3105 438/4 |
| 2013/0256265 | A1* | 10/2013 | Darling | G03F 7/0002 216/49 |
| 2014/0061531 | A1* | 3/2014 | Faur | H01L 31/068 252/79.3 |
| 2015/0099369 | A1* | 4/2015 | Deshmukh | H01L 21/32135 438/720 |

* cited by examiner

LINE EDGE ROUGHNESS IMPROVEMENT WITH PHOTON-ASSISTED PLASMA PROCESS

BACKGROUND

The disclosure relates to a method of forming semiconductor devices on a semiconductor wafer. More specifically, the disclosure relates to etching a layer in the formation of semiconductor devices.

In forming semiconductor devices, etch layers may be etched.

SUMMARY

To achieve the foregoing and in accordance with the purpose of the present disclosure, a photon-assisted plasma processing method for improving line edge roughness or line width roughness of a substrate with a process layer is provided. A process gas is flowed into the chamber. The process gas is formed into a plasma. The process layer is exposed to the plasma. The process layer is illuminated with a light with a wavelength of between 200 nm and 1 micron, while exposing the substrate to the plasma.

In another manifestation, an apparatus for processing a substrate is provided. A substrate support for supporting the substrate is within a processing chamber. A gas inlet provides gas into the processing chamber. A gas inlet connected between a gas source and the processing chamber. At least one electrode is adjacent to the processing chamber and is electrically connected to a power source. A diffuse light source illuminates sidewalls of etch features in the substrate. A controller controllably is connected to the power source, gas source, and the light source.

These and other features of the present disclosure will be described in more details below in the detailed description of embodiments and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present embodiments will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
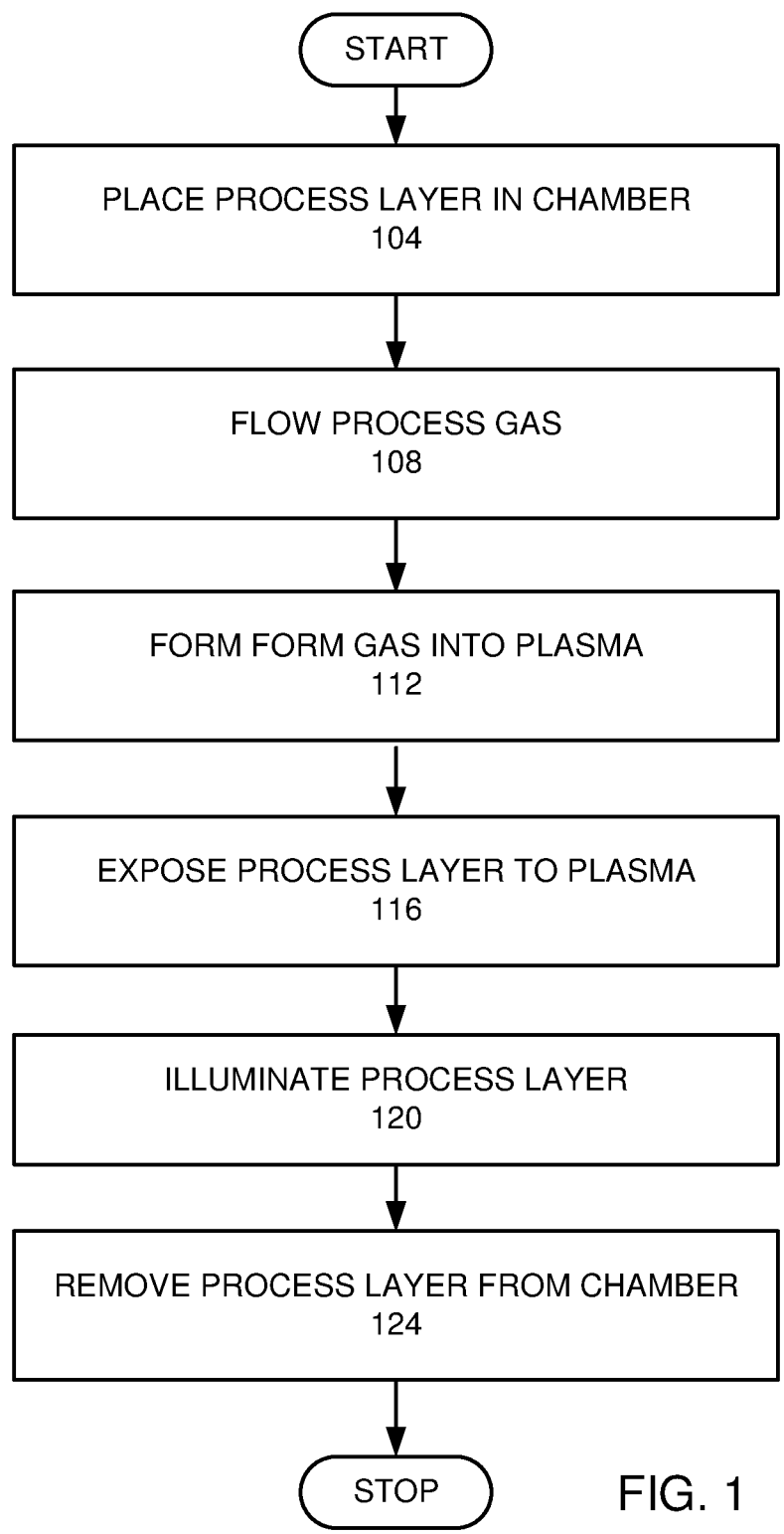
FIG. 1 is a high level flow chart of an embodiment.

FIG. 1 is a high level flow chart of an embodiment. In this embodiment, a process layer is placed in a process chamber (step 104). A process gas is flowed into the process chamber (step 108). The process gas is formed into a plasma (step 112). The process layer is exposed plasma (step 116). The process layer is illuminated (step 120). The process layer is removed from the process chamber (step 124).

EXAMPLE

Figure 2A:
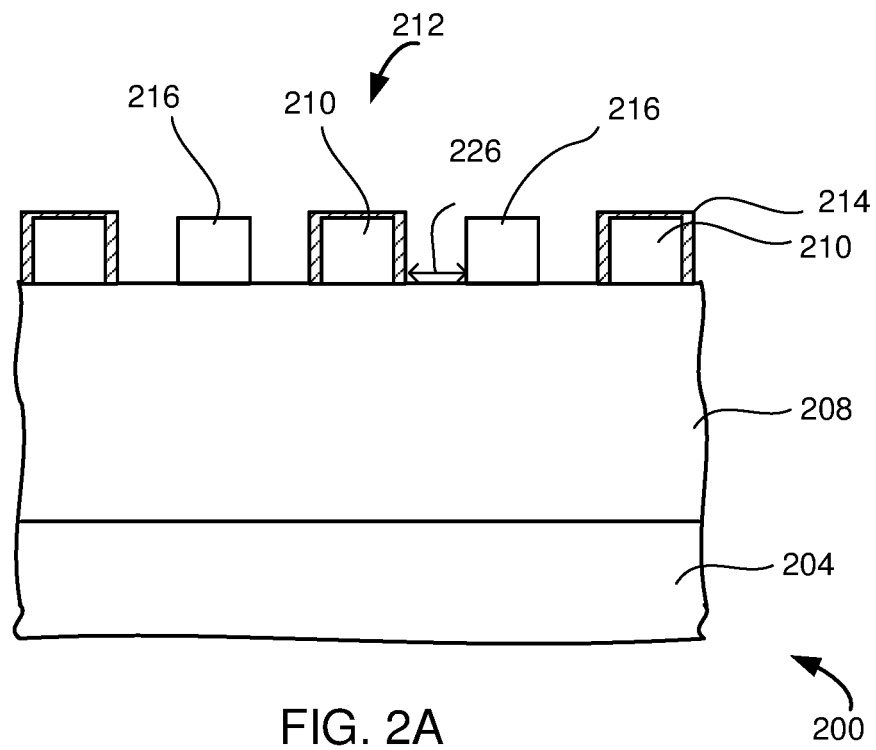
FIGS. 2A-C are schematic cross-sectional views of a stack processed according to an embodiment.

In a preferred embodiment, a substrate with a silicon oxide containing etch layer disposed under a double patterned mask is provided. Double patterned masks are known in the art and include various processes for obtaining higher resolution masks than single mask patterning processes are able to provide, allowing for smaller devices and higher density. One example of a double pattern mask is described in U.S. Pat. No. 8,282,847, entitled, "Photoresist Double Patterning," by Romano et al., issued Oct. 9, 2012, which is incorporated by reference for all purposes. Self-aligned double patterning with spacer deposition may be used to form the double patterned mask. Such processes are known in the art. An example of such processes is described in U.S. Pat. No. 7,977,242, entitled, "Double Mask Self-Aligned Patterning Technology (SADPT) Process," by Sadjadi et al., issued Jul. 12, 2011, which is incorporated by reference for all purposes. A double patterning process may be repeated to obtain a quadruple pattern mask. Multiple pattern masks may be double, triple quadruple or higher order masks. FIG. 2A is a schematic cross-sectional view of a stack 200 with a substrate 204 with a process layer 208, which in this example is a low-k dielectric etch layer comprising silicon oxide, disposed below a double patterned photoresist patterned mask 212. In this example, one or more layers may be disposed between the substrate 204 and the etch layer 208, or the etch layer 208 and the double patterned mask 212. In this example, the etch layer 208 is a bulk silicon oxide based dielectric, which may be used for forming DRAM. In this example, the double patterned mask 212 comprises first mask features 210 and second mask features 216. The first mask features 210 are surrounded by a protective coating 214, which is provided to protect the first mask features 210 during the forming of the second mask features 216. In this example, the double patterned mask 212 has a CD 226 that is less than half the CD provided by the first mask features 210 alone. In some embodiments, the double patterned mask 212 is formed before the substrate is placed in the chamber. In other embodiments, the double patterned mask 212 is formed while the substrate is in the etch chamber. The substrate 204 with the process layer 208 is placed in a process chamber (step 104).

Figure 3:
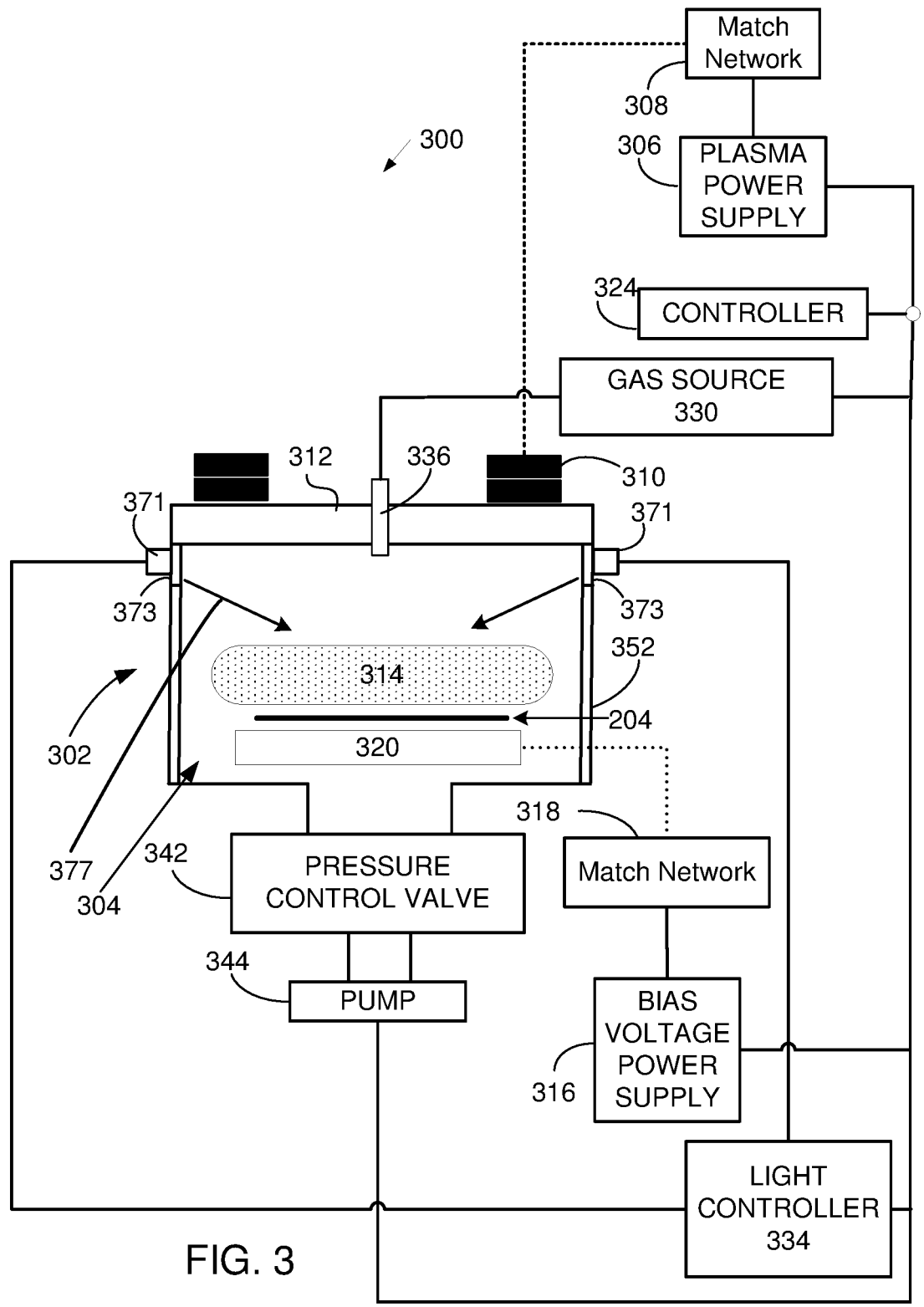
FIG. 3 is a schematic view of a etch chamber that may be used in an embodiment.

FIG. 3 schematically illustrates an example of a plasma processing system 300 which may be used to process the substrate 204 in accordance with one embodiment of the present invention. The plasma processing system 300 includes a plasma reactor 302 having a plasma processing chamber 304, enclosed by a chamber wall 352. A plasma power supply 306, tuned by a match network 308, supplies power to a TCP coil 310 located near a power window 312 to create a plasma 314 in the plasma processing chamber 304 by providing an inductively coupled power. The TCP coil (upper power source) 310 may be configured to produce a uniform diffusion profile within the plasma processing chamber 304. For example, the TCP coil 310 may be configured to generate a toroidal power distribution in the plasma 314. The power window 312 is provided to separate the TCP coil 310 from the plasma processing chamber 304 while allowing energy to pass from the TCP coil 310 to the plasma processing chamber 304. A wafer bias voltage power supply 316 tuned by a match network 318 provides power to an electrode 320 to set the bias voltage on the substrate 204 which is supported by the electrode 320. A controller 324 sets points for the plasma power supply 306 and the wafer bias voltage power supply 316.

The plasma power supply 306 and the wafer bias voltage power supply 316 may be configured to operate at specific radio frequencies such as, for example, 13.56 MHz, 27 MHz, 2 MHz, 400 kHz, or combinations thereof. Plasma power supply 306 and wafer bias voltage power supply 316 may be appropriately sized to supply a range of powers in order to achieve desired process performance. For example, in one embodiment of the present invention, the plasma power supply 306 may supply the power in a range of 50 to 5000 Watts, and the wafer bias voltage power supply 316 may supply a bias voltage of in a range of 20 to 2000 V. In addition, the TCP coil 310 and/or the electrode 320 may be comprised of two or more sub-coils or sub-electrodes, which may be powered by a single power supply or powered by multiple power supplies.

As shown in FIG. 3, the plasma processing system 300 further includes a gas source/gas supply mechanism 330. The gas source/gas supply mechanism 330 provides gas to a gas feed 336 in the form of a nozzle. The process gases and byproducts are removed from the plasma processing chamber 304 via a pressure control valve 342 and a pump 344, which also serve to maintain a particular pressure within the plasma processing chamber 304. The gas source/gas supply mechanism 330 and periphery gas source 334 are controlled by the controller 324. A modified Kiyo by Lam Research Corp. of Fremont, Calif., may be used to practice an embodiment of the invention.

In this embodiment, a light source 371 is place around the chamber wall 352. A window 373 in the chamber wall 352 allows light to pass from the light source 371 into the processing chamber 304. In this embodiment, the light source 371 and the window 373 make a ring around the processing chamber 304. The light source 371 is controllably connected to a light controller 334, which is controllably connected to the controller 324.

Figure 4:
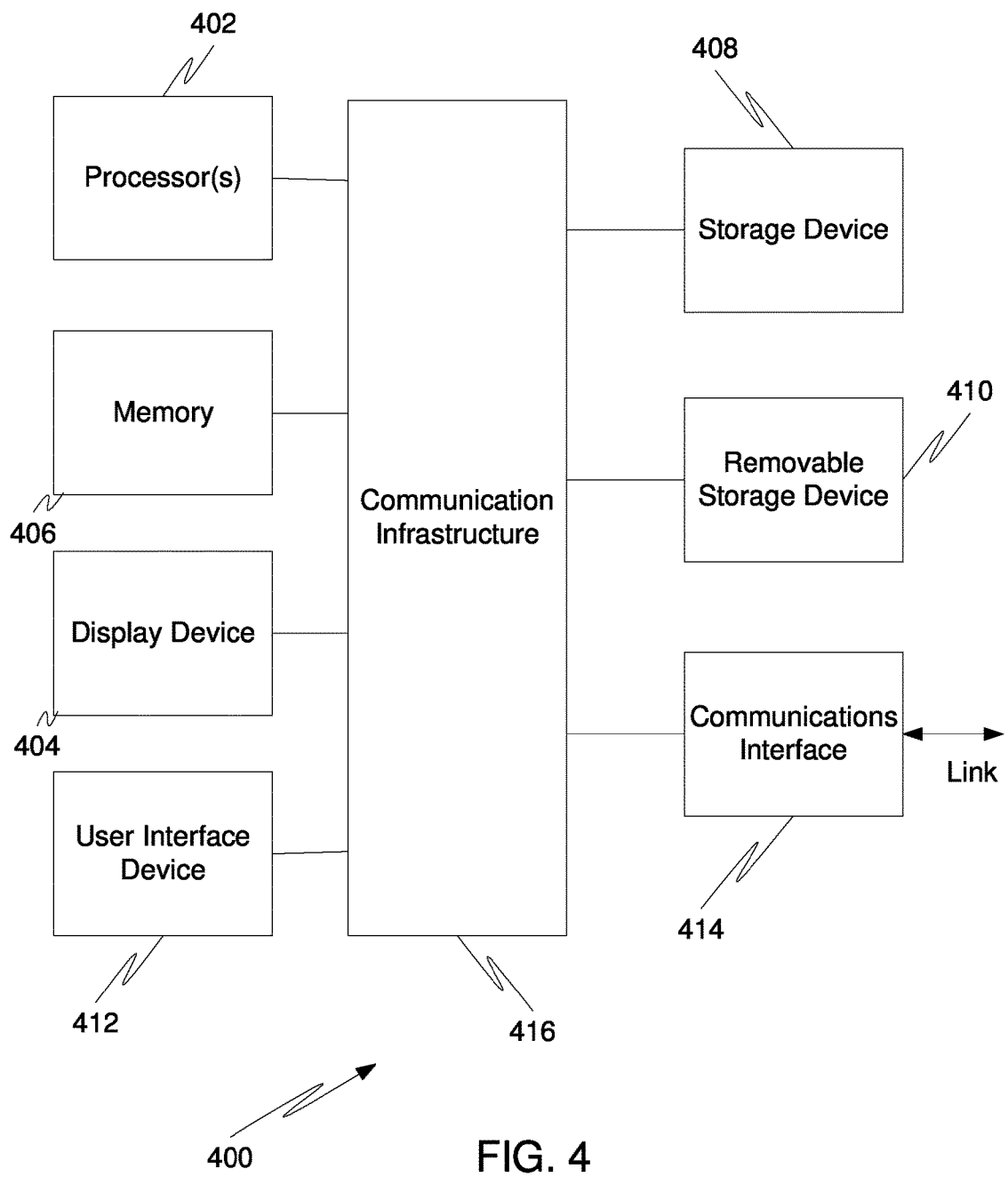
FIG. 4 is a schematic view of a computer system that may be used in practicing an embodiment.

FIG. 4 is a high level block diagram showing a computer system 400, which is suitable for implementing a controller 324 used in embodiments. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

After the substrate 204 has been placed into the plasma processing system 300, a process gas is flowed into the processing chamber (step 108). In this example, where the silicon oxide containing etch layer 208 is a bulk silicon oxide based dielectric and the patterned mask 212 is photoresist, the etch gas comprises 10 sccm $NF_3$, 5 sccm $CH_2F_2$, and 1500 sccm He. In this example, a pressure of 200 mTorr is provided. The process gas is formed into a plasma 314 (step 112). This may be accomplished by providing an excitation RF with a frequency of 13.56 MHz at 1500 watts. For high aspect ratio etches, a high bias is desirable. In this embodiment, the high bias is provided by providing an RF with a frequency of 13.56 MH provides a bias voltage of 100 volts. A temperature of 20° C. is maintained. The process layer 208 is exposed to the plasma (step 116). The plasma is maintained for 40 seconds. During the plasma process the light source 371 illuminates the process layer 208 with light 377.

Figure 2B:
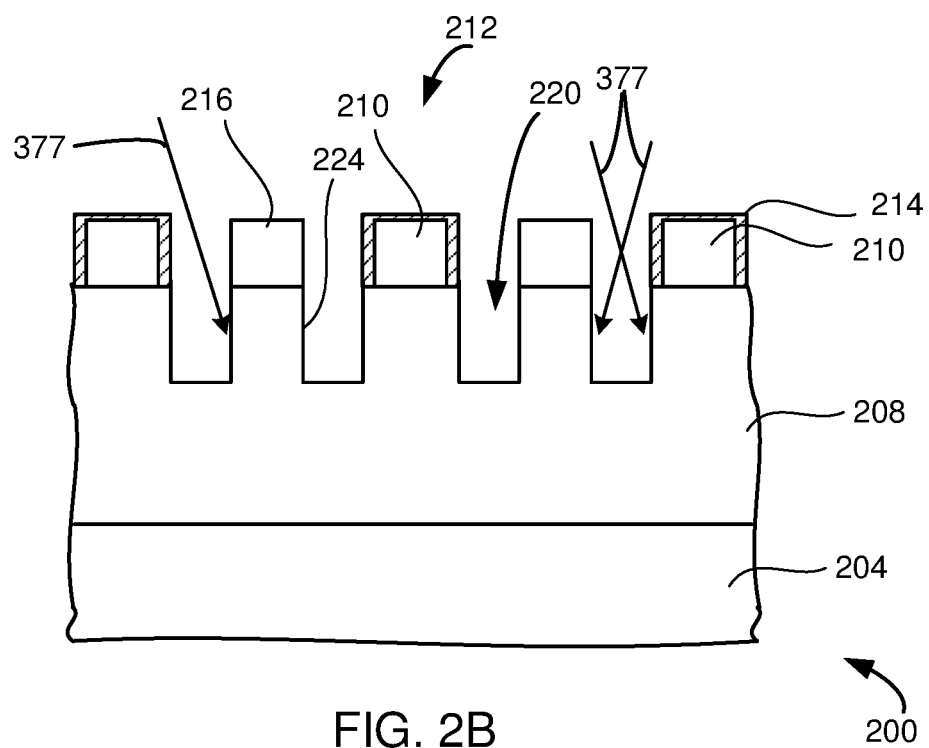

FIG. 2B is a cross-sectional view of the stack 200 after the features are partially etched, forming etched features 220 with sidewalls 224. Light 377 from the light source illuminates the sidewalls 224 of the etched features 220. The plasma processing and illumination is continued, until the process is completed, which in this example, the features 220 are completely etched. Then the flow of the process gas and the RF energy and the illumination is stopped.

Figure 2C:
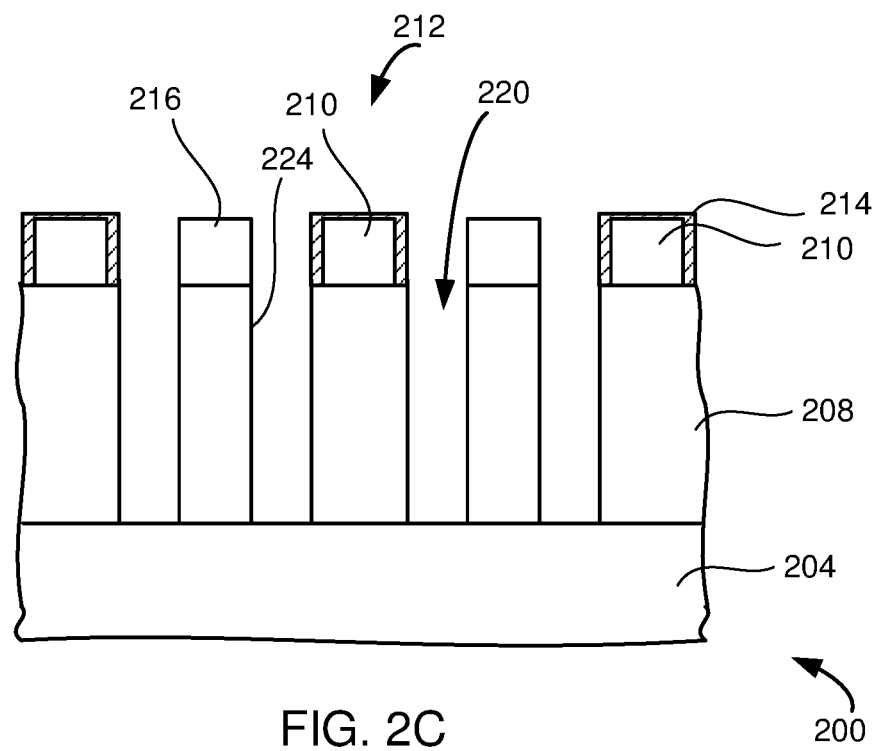

FIG. 2C is a cross-sectional view of the stack 200 after the features 220 have been etched. The features are etched lines. Such etched lines may be used in the formation of memory devices.

Line edge roughness (LER) and line width roughness (LWR) is becoming more important in micro and nanofabrication processes in the semiconductor industry. As feature size decreases, LER and LWR issues cause more device failure and yield loss. Lithography has limited contribution to improve LER due to the photoresist property and throughput concerns. Plasma treatment and plasma etch parameters may be used to further improve LER and LWR.

Figure 5:
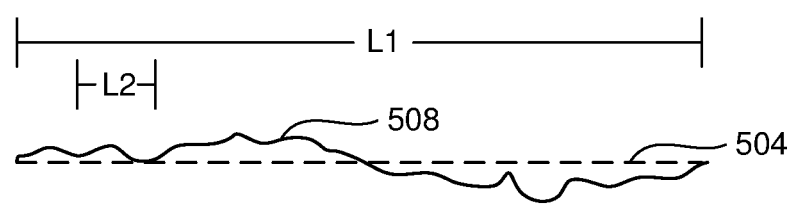
FIG. 5 is a schematic top view of a line edge.

FIG. 5 is a schematic top view of a side of an etch feature. Dashed line 504 is a line that schematically shows a sidewall if etched to form a straight edge. Line 508 illustrates the edge of a sidewall that has line edge roughness. The line edge roughness has a low frequency roughness with a long wavelength L1 and high frequency roughness with a shorter wavelength L2. In this embodiment, low frequency roughness has a wavelength of greater than 100 nm and a high frequency roughness has a wavelength of less than 20 nm.

It has been found that providing plasma etching with a combination of illumination of the sidewalls provides a photon assisted plasma etch. It has been found that the photon assisted plasma etch is able to reduce and possibly eliminate both high frequency and low frequency line edge roughness.

Without being limited by theory, it is believed that the major difference between photon-assisted plasma etching and general plasma etching or treatment is effective length scale, where the photon assist provides for a correction at both a shorter wavelength scale and longer wavelength scale. The light assisted process has both a quantum effect of energy exchange with target materials by the "particle" nature of photons, which helps smooth high frequency LER, and long impact rang of its wavelength as the "wave" nature of light, which helps smooth low frequency LER. So, when a large number (N) of photons have applied to the sidewalls shot noise may be eliminated (proportional to $1/N^{1/2}$) and any low frequency roughness with the length scale shorter than the wavelength would be reduced.

A plasma process alone relies on a "geometry factor" to smooth out the surface roughness when roughness amplitude "a" is close to the value of the length scale of roughness "l", when a is approximately equal to l, so that the surface area of a convex shape is larger than the surface area of a flat surface, so that the ratio of the surface area to volume of a convex surface is larger than the ratio of surface area to volume of a flat surface. This results in the convex surface being etched faster than a flat surface, which smoothes high frequency line edge roughness. However, for low frequency line edge roughness a is much smaller than l, so that the geometry factor is reduced, so that a plasma process alone does not sufficiently smooth low frequency line edge roughness.

With the addition of photon assist, it is believed that when a photon has sufficient energy, typically a few eV, to break a chemical bond in the target material, such as photoresist, Si, SiO, SiN, C, metal, metal oxide, or any III-V elements) or create a chemical bond of some gas species and/or target materials, a photon-assisted process occurs. An increase in density and energy of the photons, as well as an increase in the cross-section of the target molecules increases the number of photon-assisted interactions. Although, photons with longer wavelengths may not have enough energy to break chemical bonds, such photons provide a thermal impact, and thus provide a photon assist.

Photo assistance has an impact on length scale of its wavelength, which in an embodiment is between 100 nm to 3 microns. This is according to the photon's wave property and defraction behavior. For any single photon, there is a certain probability for the photon to reach a certain location. In other words, the photon is viewed as a wave reaching the plasma species and substrate with a length scale determined by the photon's wavelength.

Because of the particle and wave interactions of photons, both low frequency and high frequency LER will be smoothed by photon modification. The combination of photon impacts with plasma etching/deposition/treatment results in improved line roughness for both line width roughness (LWR) and line edge roughness (LER) for various process steps and any roughness with a scale length shorter or similar to photon impact length (or wavelength) will be improved.

In some processes the critical dimension (CD) may change with a photon-assisted process. If etching or deposition of the sidewall is continued, then line CD will continuously increase or decrease. However, in some embodiments both etching and deposition may be provided in the same plasma with a photon-assisted process for either etching or deposition or both. With a fine balance of etching and deposition (or passivation), CD can be controlled to a target value with much improved LER for both high frequency and low frequency. Since this is done during plasma etching, additional process time is not required.

Embodiments with a photo-assisted plasma process have been found to decrease both high and low frequency LER compared to a plasma process alone, as long as the photon wavelength is longer or similar to LER length scale. In addition, it has been found that the photon-assisted process does not have a significant impact in throughput compared to a plasma process alone, and does not significantly affect etch profile/selectivity or deposition conformality, so that the addition of the photon-assist is transparent.

An added external photon source could provide a single wavelength or continuous spectrum of photons, to provide flexibility. For some wavelengths, such as VUV with a wavelength<200 nm) a large portion of the photons may be lost through light paths. For these reasons, preferably the light source provides light with a wavelength between 200 nm and 1 micron. More preferably, the light source provides light with a wavelength between 300 nm and 800 nm. In-situ plasma-generated photons are more localized and provide a well controlled uniformity, which is controlled by current plasma uniformity control. Such in-situ plasma generated photons may have some side effects, such as plasma process shift. Adding an inert gas may be used to minimize chemical property change in a plasma when photon generation is boosted. The use of an external photo source may be used to eliminate such a chemical property change.

Preferably, the light source provides a light intensity against a sidewall of at least 1000 $W/m^2$. More preferably, at least 50% of the sidewalls of the features is illuminated by the light with an intensity of at least 1000 $W/m^2$. In order to meet such a criteria, at least 50% of the top of the stack is illuminated by the light with an intensity of 1000 $W/m^2$ using a light source that is able to provide 1000 $W/m^2$ to at least 50% of a top wafer supporting surface of the substrate support. However, such a condition is not by itself sufficient to provide illumination of 50% of the sidewall of the features with an intensity of 1000 $W/m^2$, since a light source directly above the stack may not provide a sufficient angle to illuminate the sidewalls with the intensity of 1000 $W/m^2$. In some embodiment, the measurement of the sidewalls of the features includes the sidewalls of the mask. In such an embodiment, at the beginning of the etch the sidewalls of the mask may make up 100% of the sidewalls of the features, so that 50% if the sidewalls of the mask is illuminated, then 50% of the sidewalls of the features is illuminated. In other embodiments, if the sidewalls of the mask is not considered part of the sidewall features, then the requirement that at least 50% of the sidewall is illuminated with an intensity of 1000 $W/m^2$ is measured after the features have been etch to at least 10% of completion. More preferably, at least 75% of the sidewalls of the features is illuminated by the light with an intensity of at least 1000 $W/m^2$. Also more preferably, at least 50% of the sidewall of the features is illuminated by the light with an intensity of at least 2000 $W/m^2$.

The photon-assisted process may be used to improve LER and LWR and even local CD and different technology nodes. This is because the improvement by photon-assist does not rely on photoresist properties, material stress, or CD loading or spacing. In addition, the reduction of LER, would be advantageous for EUV lithography.

The placement of an additional light source that illuminates the sidewalls more directly would provide more photon assist than a light source that is directed more to the top of the stack. Such a sidewall illumination source may be placed outside the diameter or outside of the outer edges of the wafer. A more overhead light source that illuminates more of the top of the stack would be above the wafer and within the outer edges of the wafer. It is preferred that the light source is able to illuminate a large surface area. Therefore, a diffuse light source is preferred. Such a diffuse light source would not be a laser beam used for measurement. It has also been found that photo-assisted etching works well with etching carbon, SiN, silicon, or SiO. In various embodiments, the multiple mask may be a patterned mask comprising at least one of photoresist, SiO, SiN, SiON, silicon, or carbon. Since the etch layer is selectively etched with respect to the mask, the mask material must be a material that can be selectively etched with respect to the etch layer. Generally, the mask material would be different from the etch layer.

Although in this embodiment an inductively coupled process chamber is used, in other embodiments a capacitively coupled chamber may be used. In other embodiments, the etch gas may use another halogen containing component. More preferably, the etch gas comprises a fluorine containing component. Preferably, the bias voltage is no more than 1000 volts.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A photon-assisted plasma processing method for improving line edge roughness or line width roughness of a substrate with a process layer, comprising:
flowing a process gas into the chamber;
forming the process gas into a plasma;
exposing the process layer to the plasma; and
illuminating the process layer with a light with a wavelength of between 200 nm and 1 micron, while exposing the substrate to the plasma, wherein a diffuse light source provides light at an intensity of at least 1000 W/m$^2$ on at least 50% of sidewalls of features.

2. The method, as recited in claim 1, wherein the process layer is an etch layer below a patterned mask, wherein the exposing the process layer to the plasma etches features with sidewalls in the etch layer, and wherein the illuminating the process layer illuminates the sidewalls of the features.

3. The method, as recited in claim 2, wherein the patterned mask is a multiple pattern mask.

4. The method, as recited in claim 3, wherein the light is provided by a diffuse light source.

5. The method, as recited in claim 4, wherein the etch layer comprises at least one of carbon, SiN, silicon, or SiO.

6. The method, as recited in claim 5, wherein the patterned mask comprises at least one of photoresist, SiO, SiN, SiON, Si, or carbon, and wherein the etch layer is selectively etched with respect to the patterned mask.

7. The method, as recited in claim 6, wherein the process gas is an etch gas comprising a halogen containing component, which allows for the etching of the process layer.

8. The method, as recited in claim 2, wherein the etch layer comprises at least one of carbon, SiN, silicon, or SiO.

9. The method, as recited in claim 2, wherein the patterned mask comprises at least one of photoresist, SiO, SiN, SiON, Si, or carbon, and wherein the etch layer is selectively etched with respect to the patterned mask.

10. The method, as recited in claim 2, wherein the process gas is an etch gas comprising a halogen containing component, which allows for the etching of the process layer.

11. The method, as recited in claim 1, wherein the light is provided by a diffuse light source.

* * * * *